US010424896B2

(12) United States Patent
Hasegawa (10) Patent No.: US 10,424,896 B2
(45) Date of Patent: Sep. 24, 2019

(54) LASER LIGHT SOURCE MODULE AND METHOD OF SPECIFYING FAILURE LASER DIODE

(71) Applicant: Mitsubishi Electric Corporation, Tokyo (JP)

(72) Inventor: Koji Hasegawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/069,716

(22) PCT Filed: Mar. 29, 2016

(86) PCT No.: PCT/JP2016/060140
§ 371 (c)(1),
(2) Date: Jul. 12, 2018

(87) PCT Pub. No.: WO2017/168565
PCT Pub. Date: May 10, 2017

(65) Prior Publication Data
US 2019/0020173 A1    Jan. 17, 2019

(51) Int. Cl.
*H01S 5/068* (2006.01)
*H01S 5/00* (2006.01)
(Continued)

(52) U.S. Cl.
CPC .............. *H01S 5/0014* (2013.01); *G01J 1/44* (2013.01); *H01S 5/042* (2013.01);
(Continued)

(58) Field of Classification Search
CPC ...... H01S 5/0014; H01S 5/042; H01S 5/4018; H01S 5/06825; G01J 1/44; G01J 2001/4473
See application file for complete search history.

(56) References Cited

U.S. PATENT DOCUMENTS 4,745,610 A    5/1988 Yoshikawa
5,459,328 A *  10/1995 Kadota ............... H01S 5/06825
                                                     250/214 A
(Continued)

FOREIGN PATENT DOCUMENTS

EP    1641325 A2    3/2006
JP    6-338647 A    12/1994
(Continued)

OTHER PUBLICATIONS

International Search Report (PCT/ISA/210) issued in PCT/JP2016/060140, dated Jun. 28, 2016.
(Continued)

*Primary Examiner* — Xinning(Tom) Niu
(74) *Attorney, Agent, or Firm* — Birch, Stewart, Kolasch & Birch, LLP (57) ABSTRACT

It is an object of the present invention to provide a laser light source module capable of diverting current flowing to a laser diode when the laser diode does not emit light. A laser light source module includes a laser diode, a bypass circuit parallelly connected to the laser diode and diverting current flowing to a laser diode in an on state, a light detection circuit detecting laser light of the laser diode, and the bypass circuit switching circuit switching the bypass circuit to the on state in accordance with a control signal being input thereto, and the bypass circuit switching circuit can switch the bypass circuit to the on state in accordance with a state where the light detection circuit does not detect the laser light.

7 Claims, 8 Drawing Sheets

(51) Int. Cl.
*H01S 5/042* (2006.01)
*G01J 1/44* (2006.01)
*H01S 5/40* (2006.01)

(52) U.S. Cl.
CPC ........ *H01S 5/06825* (2013.01); *H01S 5/4018* (2013.01); *G01J 2001/4473* (2013.01)

(56) References Cited

U.S. PATENT DOCUMENTS

| | | |
|---|---|---|
| 6,153,980 A | 11/2000 | Marshall et al. |
| 6,198,571 B1 * | 3/2001 | Yang .................... H01S 3/1301 359/337 |
| 2003/0090817 A1 * | 5/2003 | Nolan ................ G02B 27/0025 359/831 |
| 2003/0218589 A1 * | 11/2003 | Watanabe ............ G09G 3/3648 345/87 |
| 2005/0018726 A1 | 1/2005 | Dinger et al. |

FOREIGN PATENT DOCUMENTS

| | | |
|---|---|---|
| JP | 2005-57063 A | 3/2005 |
| JP | 2005-530332 A | 10/2005 |

OTHER PUBLICATIONS

Extended European Search Report dated Jun. 21, 2019 in corresponding European Application No. 16896785.9.

* cited by examiner

| STATE OF LASER DIODE (LD) | VOLTAGE BETWEEN POWER SUPPLY TERMINALS (CONTROL SIGNAL: HIGH) | VOLTAGE BETWEEN POWER SUPPLY TERMINALS (CONTROL SIGNAL: LOW) | CONTROL OF BYPASS CIRCUIT (EFFECTIVE/INEFFECTIVE) |
|---|---|---|---|
| NORMAL | Vf | Vf | INEFFECTIVE (LD EMITS LIGHT) |
| OPEN FAILURE | ZERO VOLTAGE (SHORT CIRCUIT) | RELEASE VOLTAGE | EFFECTIVE (LD DOES NOT EMIT LIGHT) |
| HALF SHORT-CIRCUIT FAILURE | ZERO VOLTAGE (SHORT CIRCUIT) | FLOATING VOLTAGE | |
| NO LIGHT EMISSION WITH Vf | ZERO VOLTAGE (SHORT CIRCUIT) | Vf | |

LASER LIGHT SOURCE MODULE AND METHOD OF SPECIFYING FAILURE LASER DIODE

TECHNICAL FIELD

The present invention relates to a laser light source module and a method of specifying a failure laser diode.

BACKGROUND ART

A light source device such as a digital cinema projector includes a plurality of laser light source modules as a light source to obtain a high light output. General as a system of driving the plurality of the laser light source modules in the light source device is a drive system of electrically connecting the laser light source modules in series and evenly flowing current in each module. However, there is a problem described below in a case of electrically connecting the plurality of the laser light source modules in series and driving them.

In case of an open mode failure in a laser diode (also referred to as an LD hereinafter) (in case of a failure that the LD is not conducted and does not emit light), all of the laser light source modules connected to the defective laser light source module in series do not emit light. This means that a light output from the light source device decreases to zero, and causes a critical failure of not only the light source device but also a whole video system.

Also when the LD does not emit light while maintaining diode characteristics, generated in the defective laser light source module is heat larger than that in a normal light emission by a light emission energy. The light output of the other laser light source module needs to be increased to compensate the light output of the defective laser light source module. When a drive current is increased to increase the light output, a thermal load further increases, thereby sharply reducing reliability of the light source device.

Also in case of a half short-circuit mode failure in the LD, the drive current needs to be increased to maintain the light output as the whole light source device. When the drive current is increased, the current is concentrated in a point where the half short-circuit failure occurs, thereby leading to a burnout or a disconnection, for example. Accordingly, reliability is seriously damaged in a continuous operation of the light source device. However, in case of a complete short-circuit failure in the LD, there is no problem in operating the plurality of the laser light source modules electrically connected in series.

Proposed is a technique of continuing a light output of a light source device when any of a plurality of laser light source modules breaks down. For example, Patent Document 1 describes that when an LD breaks down, current is diverted to a substitute diode or LD parallelly connected to the LD, thereby maintaining a continuous operation of a light source device in an open failure. Patent Document 2 describes a configuration that a switching element is parallelly connected to an LD, and when voltage applied to the LD due to a failure of the LD exceeds a threshold value, the switching element diverts current flowing to the LD.

PRIOR ART DOCUMENTS

Patent Documents

Patent Document 1: Japanese Patent Application Laid-Open No. 2005-57036

Patent Document 2: Japanese Unexamined Patent Application Publication (Translation of PCT Application) No. 2005-530332

SUMMARY

Problem to be Solved by the Invention

In the substitute diode or the substitute laser diode parallelly connected to the LD in Patent Document 1, a forward voltage (Vf) is set higher than that in the laser diode. That is to say, a failure of the laser diode is accompanied with heat in the substitute diode higher than that in a normal state. Accordingly, required is a heat radiation design for preventing the heat of the substitute diode from having an influence on the other normal LD. Particularly, a large margin for cooling capacity and cooling space is necessary, so that a cost for the heat radiation increases.

In Patent Document 2, the failure is detected by measuring the voltage in each LD, however, a failure that the LD does not emit the light while maintaining the diode characteristics, occurring most frequently in the failure of the LD, cannot be detected.

The present invention therefore has been made to solve these problems, and it is an object of the present invention to provide a laser light source module capable of diverting current flowing to a laser diode to a bypass circuit when the laser diode does not emit light. It is also an object of the present invention to provide a light source device capable of continuing an light output from the other laser light source module even when a laser diode in any of the laser light modules does not emit light in the light source device in which a plurality of laser light source modules are electrically connected in series and driven. It is also an object of the present invention to provide a method of specifying a failure laser diode to specify a defective laser diode in a light source device.

Means to Solve the Problem

A laser light source module according to the present invention includes a laser diode, a bypass circuit parallelly connected to the laser diode and diverting current flowing to a laser diode when the bypass circuit is in an on state, a light detection circuit detecting laser light of the laser diode, and a bypass circuit switching circuit switching the bypass circuit to the on state in accordance with a control signal being input thereto, and the bypass circuit switching circuit can switch the bypass circuit to the on state in accordance with a state where the light detection circuit does not detect the laser light.

Effects of the Invention

In the laser light source module according to the present invention, the bypass circuit can be switched to the on state in accordance with the state where the light detection circuit does not detect the laser light. Accordingly, even when the laser diode has a failure that the laser diode does not emit the light while maintaining diode characteristics, the current can be reliably diverted to the bypass circuit.

These and other objects, features, aspects and advantages of the present invention will become more apparent from the following detailed description of the present invention when taken in conjunction with the accompanying drawings.

DESCRIPTION OF EMBODIMENT(S)

<Embodiment 1>
<Configuration of Laser Light Source Module>

Figure 1:
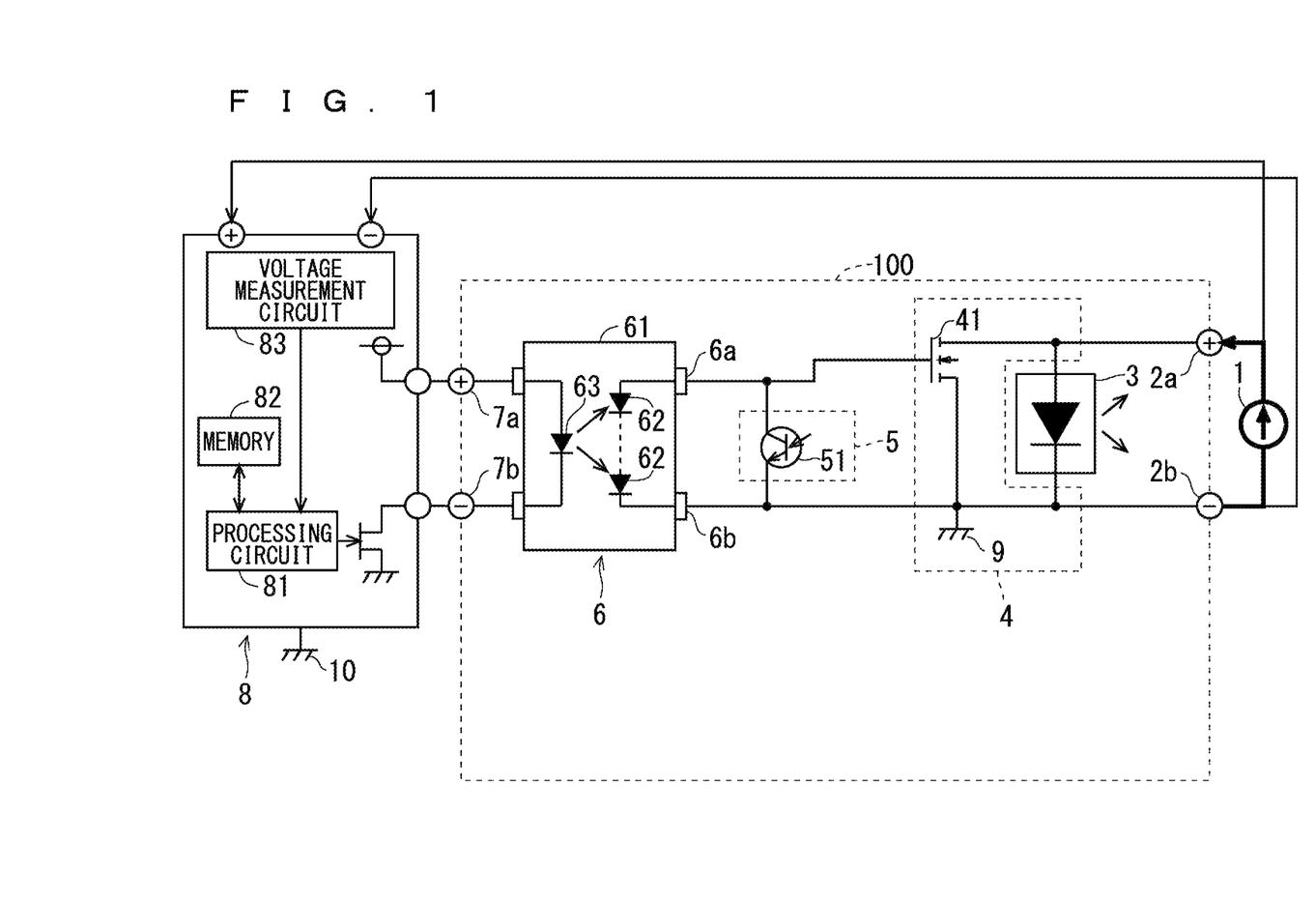
FIG. 1 A drawing illustrating a circuit configuration of a laser light source module according to an embodiment 1.

FIG. 1 is a drawing illustrating a circuit configuration of a laser light source module 100 according to the present embodiment 1. As illustrated in FIG. 1, the laser light source module 100 includes a laser diode 3 (also referred to as an LD 3 hereinafter), a bypass circuit 4, a light detection circuit 5, and a bypass circuit switching circuit 6.

The laser light source module 100 has power supply terminals 2a and 2b as terminals for supplying power to the LD 3. A current source 1 is connected to the power supply terminals 2a and 2b. The bypass circuit 4 is parallelly connected to the LD 3. The bypass circuit 4 is a circuit for diverting current flowing to the LD 3 when the bypass circuit is in an on state.

The bypass circuit 4 has a switching element 41. The switching element 41 is an N channel MOSFET (enhancement type), for example. A reason of selecting the N channel MOSFET as the switching element 41 is that it is small in size as an element which performs a switching control on a large current of approximately tens of amperes, and that it has an extremely low conductive resistance of several milliohms when the switch is in an on state (conductive state). Since the conductive resistance is low, approximately several milliohms, a drive current of the LD 3 (approximately tens of amperes) can be diverted while suppressing heat. It is preferable that the switching element 41 is a sufficiently small conductive resistance even when the LD 3 breaks down and thereby enters a half short-circuit state.

The light detection circuit 5 detects laser light of the LD 3. A function of the light detection circuit 5 is achieved by a photo transistor 51, for example. The photo transistor 51 is disposed to receive part of the laser light of the LD 3. Upon detecting the laser light, the light detection circuit 5 switches a control terminal of the switching element 41 and a laser diode ground 9 (also referred to as an LD_GND 9 hereinafter) from a non-conduction state to a conduction state.

That is to say, the light detection circuit 5 makes the LD_GND 9 short-circuit to the control terminal of the switching element 41 of the bypass circuit 4. In the meanwhile, the light detection circuit 5 disconnects the control terminal of the switching element 41 from the LD_GND 9 in a state where the light detection circuit 5 does not detect the laser light.

Figure 2:
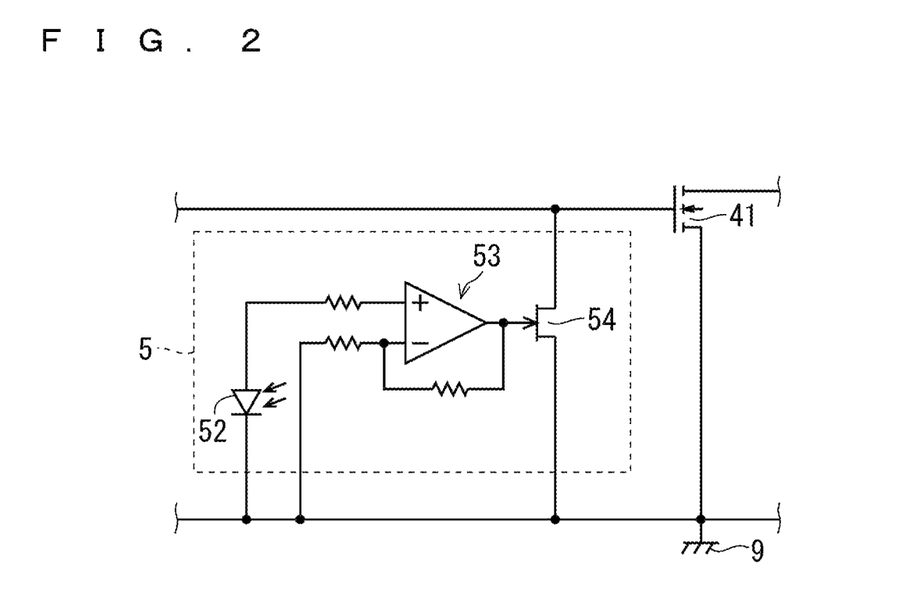
FIG. 2 A drawing illustrating another configuration example of a light detection circuit of the laser light source module according to the embodiment 1.

FIG. 2 illustrates another configuration example of the light detection circuit 5. Although the function of the light detection circuit 5 is achieved by the photo transistor 51, as illustrated in FIG. 2, the function of the light detection circuit 5 may also be achieved by a combination of a photo diode 52, a schmitt trigger circuit 53 including a comparator (also referred to as a hysteresis circuit), and a switching element 54, for example. In the above case, a power supply path to the comparator needs to be provided separately to prevent a disruption of the power to the comparator caused by switching the switching element 54.

In the light detection circuit 5, the photo transistor 51 and a light receiving unit of a light detection element such as a photo diode are disposed in a position where part of the laser light of the LD 3 can be received. The position where the part of the laser light can be received indicates an end surface opposite to an emission end surface of the LD 3 and a position near a collimator lens which parallelizes an emission light from the LD 3.

As illustrated in FIG. 1, the laser light source module 100 includes control terminals 7a and 7b. A control signal is input from a control unit 8 to the bypass circuit switching circuit 6 via the control terminals 7a and 7b. The bypass circuit switching circuit 6 switches the bypass circuit 4 to an on state in accordance with the control signal being input thereto.

The bypass circuit switching circuit 6 has a photovoltaic output photo coupler 61. The photovoltaic output photo coupler 61 has an LED, for example, as a light emitting element 63 on an input side thereof. The photovoltaic output photo coupler 61 has a plurality of photo diodes connected in series as a photoelectric conversion element 62 on an output side thereof. A drive current (a control signal of high or low) is supplied to the light emitting element 63 via the control terminals 7a and 7b. When the light emitting element 63 emits light, a light energy is input to the photoelectric conversion element 62, and a predetermined voltage is generated between output terminals 6a and 6b of the photovoltaic output photo coupler 61.

The photovoltaic output photo coupler 61 has a feature that the light emitting element 63 on the input side and the photoelectric conversion element 62 on the output side are electrically insulated from each other. The photovoltaic output photo coupler 61 can provide the switching element 41 with a control voltage (bias) by an electromotive force based on the LD_GND 9 electrically insulated from a control ground 10 of the control unit 8. Since the input side and output side of the bypass circuit switching circuit 6 are insulated from each other, the switching element 41 is in an on state (a conduction state), thus this state can be stably maintained even after the power supply terminals 2a and 2b are short-circuited.

In accordance with a state where the light detection circuit 5 does not detect the laser light, the bypass circuit switching circuit 6 can switch the bypass circuit 4 to the on state. Since the light detection circuit 5 is in the conduction state when the light detection circuit 5 detects the laser light, both ends of the photoelectric conversion element 62 of the bypass circuit switching circuit 6 is short-circuited. Thus, the voltage is not applied to the control terminal of the switching element 41 of the bypass circuit 4. In this state, the current supplied from a current source 1 is not diverted to the bypass circuit 4 but is supplied to the LD 3.

In the meanwhile, since the light detection circuit 5 is in the non-conduction state when the light detection circuit 5 does not detect the laser light, the voltage generated in the both ends of the photoelectric conversion element 62 of the bypass circuit switching circuit 6 is applied to the control terminal of the switching element 41 of the bypass circuit 4. When the voltage is applied to the control terminal of the switching element 41 and the switching element 41 enters the on state (that is to say, the bypass circuit 4 enters the on state), the current supplied to the LD 3 is diverted to the bypass circuit 4.

Figure 3:
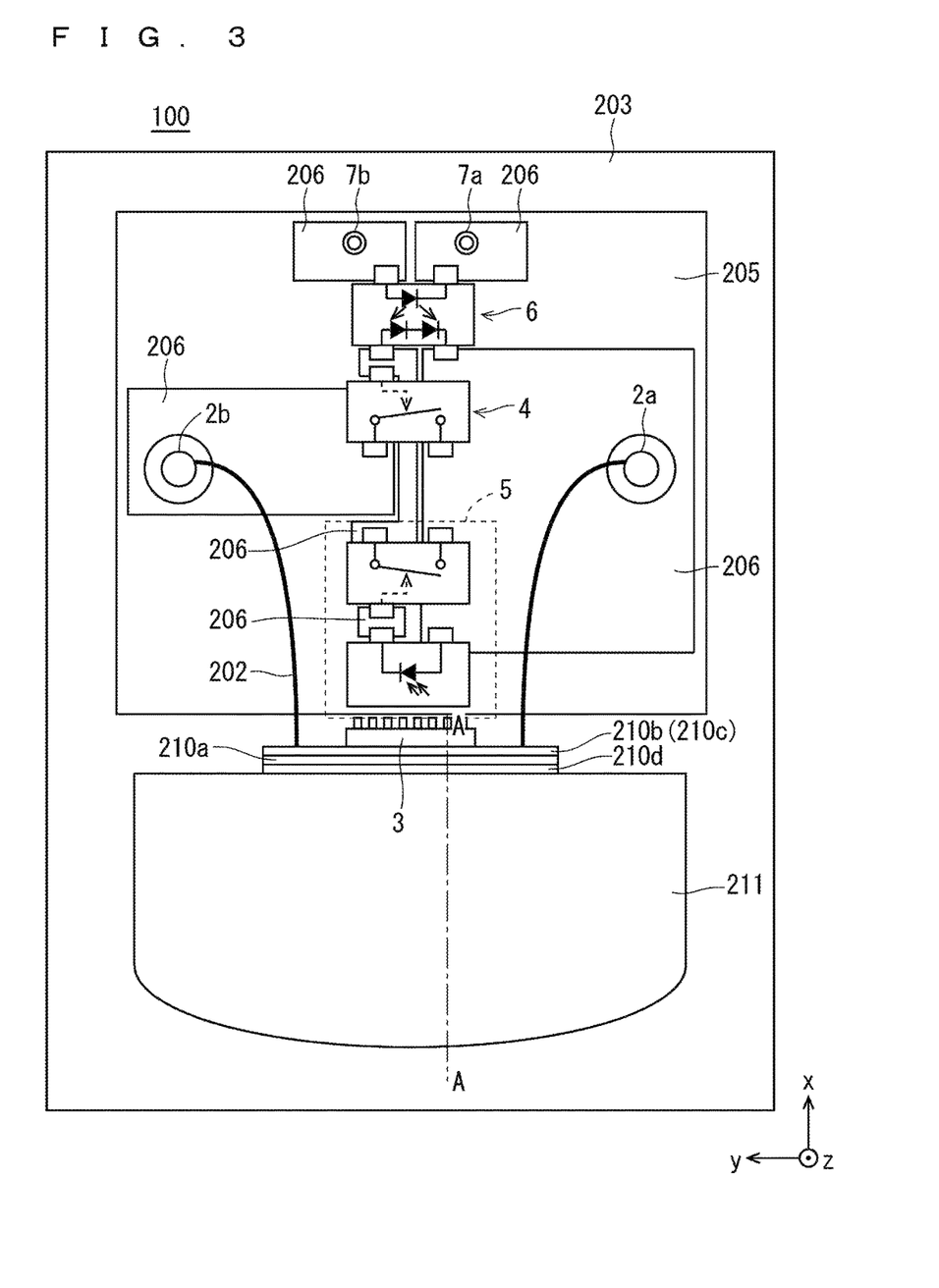
FIG. 3 A planar view of the laser light source module according to the embodiment 1.
Figure 4:
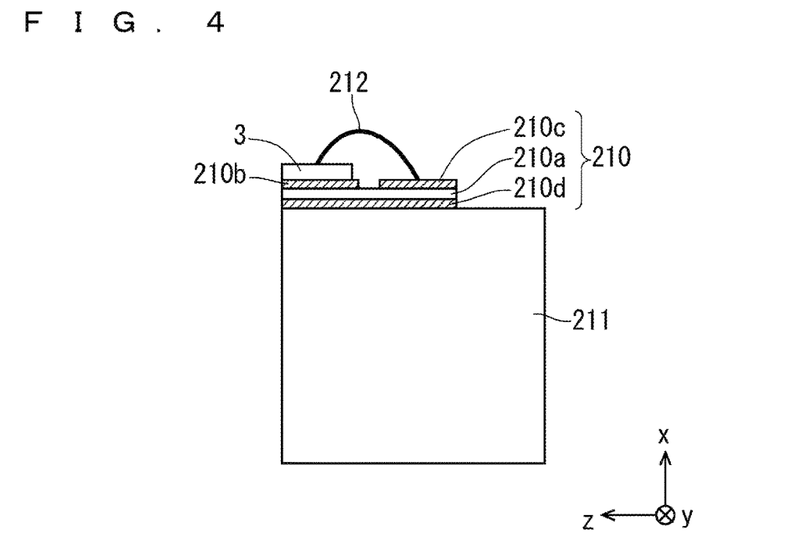
FIG. 4 A cross-sectional view of the laser light source module according to the embodiment 1.
Figure 5:
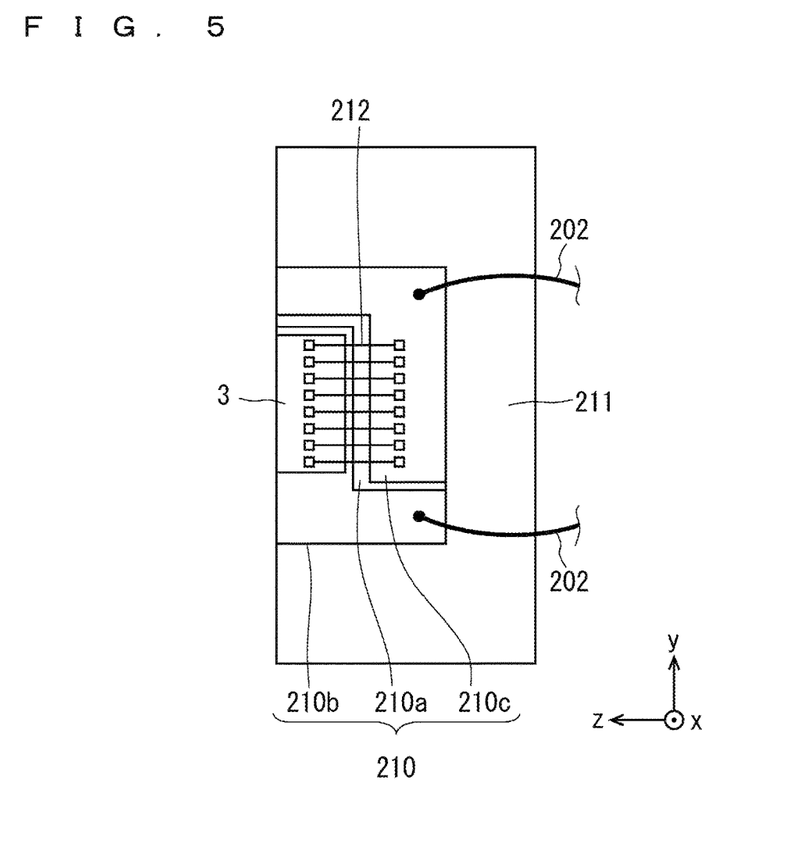
FIG. 5 A planar view of a laser diode according to the embodiment 1.

FIG. 3 is a planar view of the laser light source module 100. FIG. 4 is a cross-sectional view of a retention block 211, a sub-mount substrate 210, and the LD 3 along a segment A-A in FIG. 3. FIG. 5 is a planar view of the retention block 211, the sub-mount substrate 210, and the LD 3.

As illustrated in FIG. 3, a substrate 205 and the retention block 211 are fixed to a stem base 203. A conductive pattern 206 is formed on the substrate 205. The control terminals 7a and 7b, the power supply terminals 2a and 2b, the bypass circuit 4, the light detection circuit 5, and the bypass circuit switching circuit 6, for example, are disposed in a predetermined region of the conductive pattern 206.

The sub-mount substrate 210 is disposed on the retention block 211. As illustrated in FIG. 4, a retention block-side conductive pattern 210d is formed on a rear surface side (a side of the retention block 211) of an insulating substrate 210a in the sub-mount substrate 210. As illustrate in FIG. 5, conductive patterns 210b and 210c corresponding to a p-side electrode and an n-side electrode of the LD 3, respectively, are formed on an upper surface side of the insulating substrate 210a. A rear surface electrode of the LD 3 is bonded to the conductive pattern 210b. The conductive pattern 210c is connected to an upper surface electrode of the LD 3 via a conductive wiring 212. The power supply terminals 2a and 2b are connected to each of the conductive patterns 210b and 210c via a conductive ribbon 202.

When the conductive pattern 206 is formed and the bypass circuit 4, the light detection circuit 5, and the bypass circuit switching circuit 6 are disposed as illustrated in FIG. 3, an increase in size of the semiconductor module 100 can be reduced.

<Configuration of Light Source Device>

Figure 6:
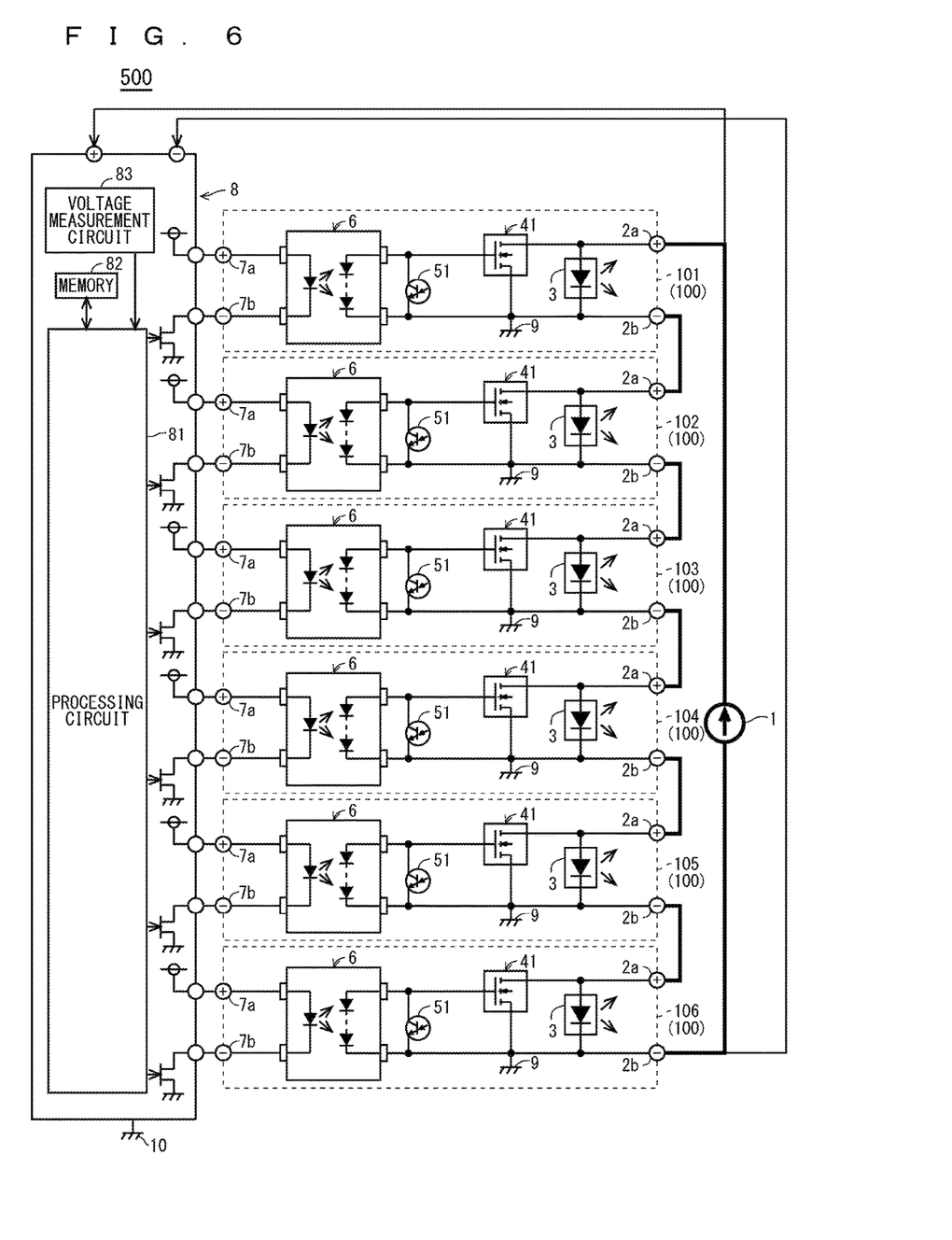
FIG. 6 A drawing illustrating a circuit configuration of a light source device according to the embodiment 1.

FIG. 6 is a drawing illustrating a configuration of a light source device 500 according to the present embodiment 1. As illustrated in FIG. 6, the light source device 500 includes a plurality of laser light source modules 101 to 106, the control unit 8, and the current source 1.

The plurality of the laser light source modules 101 to 106 are connected in series. Each of the laser light source modules 101 to 106 has the same configuration as the laser light source module 100 illustrated in FIG. 1.

The control unit 8 outputs the control signal separately to the bypass circuit switching circuit 6 of each of the laser light source modules 101 to 106. That is to say, in FIG. 6, the control unit 8 has six control signal output units, and each output unit can independently output the control signal. The current source 1 supplies the current to the plurality of the laser light source modules 101 to 106 connected in series.

In FIG. 6, the light source device 500 has a configuration of including the six laser light source modules 101 to 106, however, the number of the laser light source modules is not limited thereto. The optional number of the laser light source modules can be disposed in accordance with a light output required for the light source device 500 and a drive capacity of the current source 1.

The control unit 8 in FIG. 1 and FIG. 6 is achieved by a processing circuit 81. The processing circuit 81 may be dedicated hardware or a CPU (also referred to as a Central Processing Unit, a processing apparatus, an arithmetic device, a microprocessor, a microcomputer, a processor, and a DSP) for executing a program stored in a memory 82.

When the processing circuit 81 is the dedicated hardware, a single circuit, a complex circuit, a programmed processor, a parallel-programmed processor, an ASIC, a FPGA, or a combination of them, for example, falls under the processing circuit 81.

When the processing circuit 81 is the CPU, the function of the control unit 8 is achieved by software, firmware, or a combination of software and firmware. The software or the firmware is described as a program and is stored in the memory 82. The processing circuit 81 reads out and executes the program stored in the memory 82, thereby achieving the function of the control unit 8. This program is deemed to make the computer execute a procedure or a method of the control unit 8. Herein, a non-volatile or volatile semiconductor memory such as a RAM, a ROM, a flash memory, an EPROM, or an EEPROM, a magnetic disc, a flexible disc, an optical disc, a compact disc, a mini disc, or a DVD, for example, falls under the memory 82.

It is also applicable to achieve a part of the function of the control unit 8 by dedicated hardware and achieve another part thereof by software or firmware. The control unit 8 is achieved by a microcontroller, for example.

<Operation of Laser Light Source Module>

Figure 7:
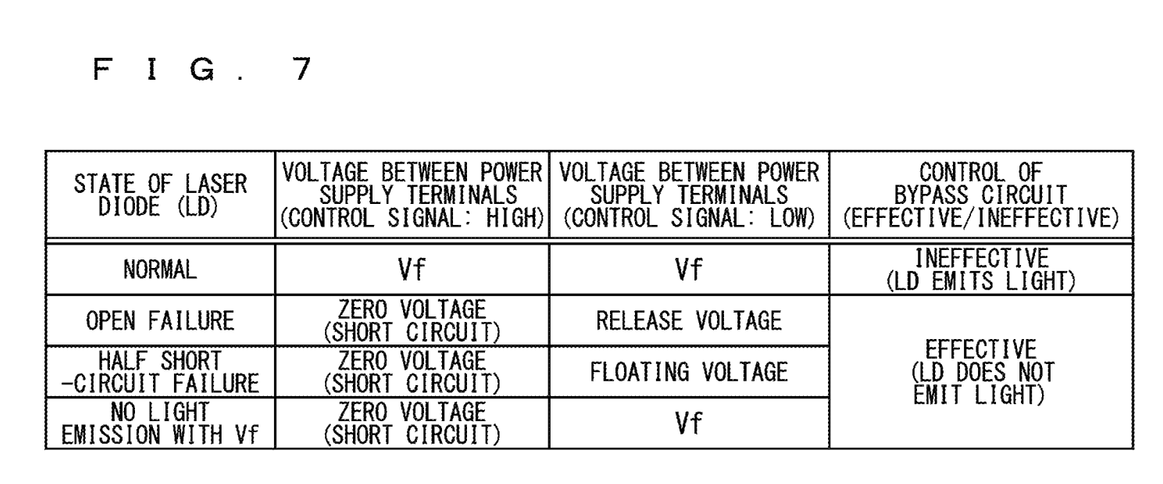
FIG. 7 A drawing illustrating a relationship between a failure state of a laser diode of the laser light source module according to the embodiment 1 and voltage between power supply terminals.

FIG. 7 is a drawing illustrating a relationship between a failure state of the LD 3 of the laser light source module 100 and the voltage between the power supply terminals 2a and 2b illustrated in FIG. 1. Herein, the voltage between the power supply terminals 2a and 2b indicates the voltage between both ends of the current source 1 supplying the current to the power supply terminals 2a and 2b.

A state of the LD (a type of failure) is described using FIG. 7. Firstly, "normal" indicates a state where there is no failure in the LD. A forward voltage occurring when a prescribed current flows from the current source 1 to the normal LD is referred to as Vf. "An open failure" indicates a state where the current does not flow in the LD. At this time, the voltage between the power supply terminals 2a and 2b is a release voltage of the current source 1. "A half short-circuit failure" indicates an incomplete short-circuit state in the LD. At this time, the voltage between the power supply terminals 2a and 2b is smaller than the release voltage. "No light emission with Vf" indicates a state where the LD does not emit the light while maintaining the diode characteristics.

As illustrated in FIG. 2, the control of the bypass circuit 4 is ineffective in a state where the LD is "normal" (that is to say, a state where the LD emits the light). In the meanwhile, the control of the bypass circuit 4 is effective in a state where the failure such as "the open failure", "the half short-circuit failure", or "the no light emission with Vf" (that is to say, a state where the LD does not emit the light) occurs.

As illustrated in FIG. 2, when the bypass circuit 4 enters the on state, the power supply terminals 7a and 7b are short-circuited by the bypass circuit 4, thus the voltage between the power supply terminals decreases to zero.

The light detection circuit 5 detects the laser light when the LD emits the light normally. Thus, the control terminal of the switching element 41 of the bypass circuit 4 is short-circuited by the LD_GND 9. In the above state, the bypass circuit 4 is maintained in the off state, that is to say, in a state where the current flowing in the LD 3 is not diverted.

The light detection circuit 5 does not detect the laser light when the LD element does not emit the light. The control terminal of the switching element 41 of the bypass circuit 4 is electrically disconnected from the LD_GND 9 in the state where the light detection circuit 5 does not detect the laser light. In the above state, the control terminal of the switching element 41 of the bypass circuit 4 enters a controllable state. That is to say, the control unit 8 can switch the bypass circuit 4 to the on state via the bypass circuit switching circuit 6 under the control signal.

The control unit 8 outputs the control signal for making the bypass circuit 4 enter the on state (the control signal: high) while the LD 3 emits the light. That is to say, the current flows in the light emitting element 63, and the light emitting element 63 emits the light in the bypass circuit switching circuit 6. Since the light detection circuit 5 detects the laser light while the LD 3 emits the light, the control of the bypass circuit 4 is ineffective. That is to say, the power supply to the LD 3 is maintained regardless of the control signal being output by the control unit 8.

When the LD 3 does not emit the light, the light detection circuit 5 does not detect the laser light, and the control of the bypass circuit 4 is effective. At this time, the control unit 8 outputs the control signal for making the bypass circuit 4 enter the on state, thus when the LD 3 does not emit the light, the bypass circuit 4 immediately enters the on state. When the bypass circuit 4 enters the on state, the current flowing from the current source 1 to the LD 3 is diverted to the bypass circuit 4.

<Method of Specifying Defective Laser Diode>

The light source device 500 illustrated in FIG. 6 shows an example of connecting the six laser light source modules 101 to 106 in series. When the number of the laser light source modules connected in series is indicated by n, the control unit 8 can specify the defective LD by repeating a determination operation r times satisfying $2^{r-1}<n\leq 2^r$ at a maximum. For example, in a case of n=6, the defective LD can be specified by performing the determination operation three times. Also in a case of n=100, the defective LD can be specified by performing the determination operation seven times.

Figure 8:
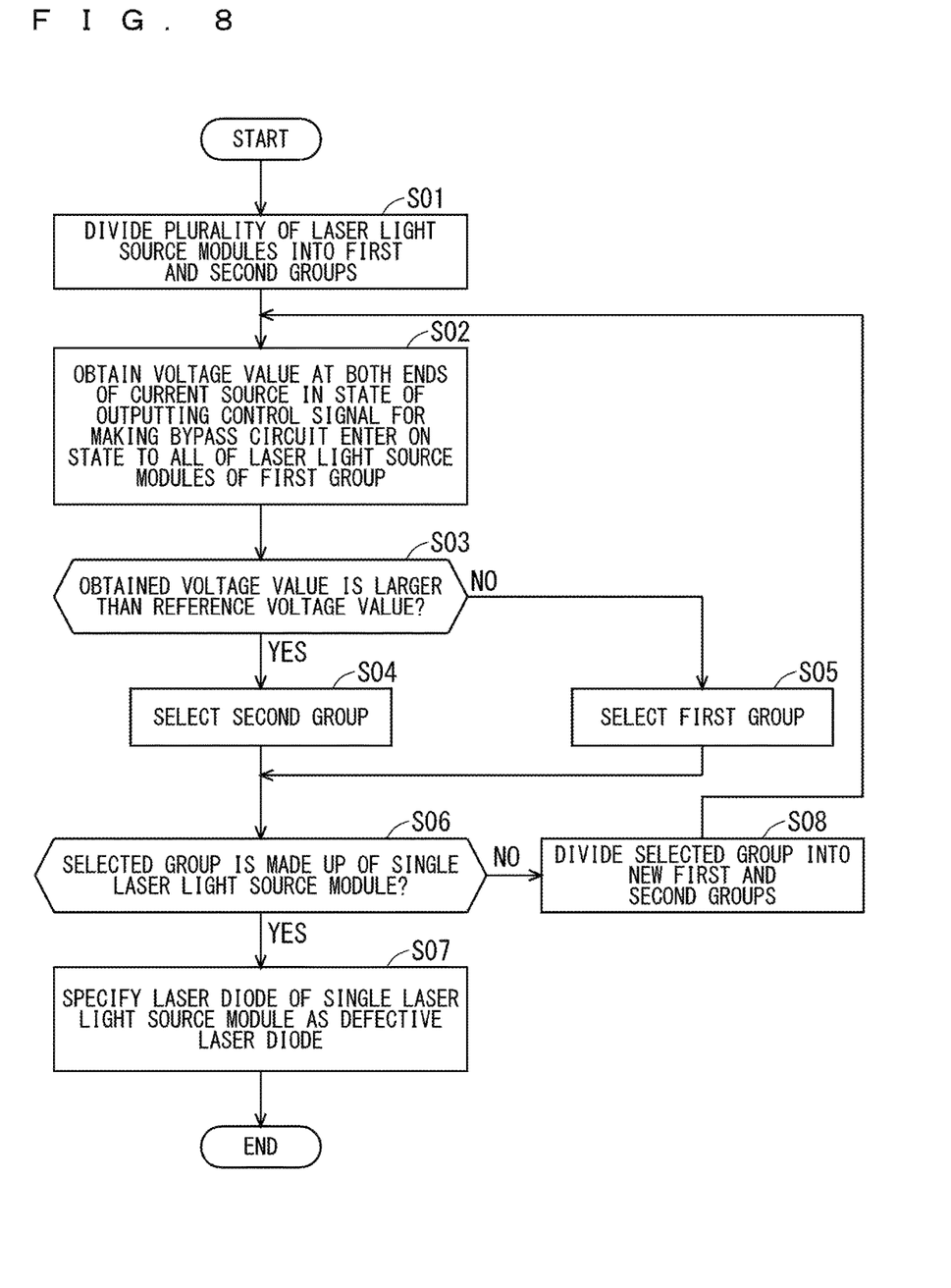
FIG. 8 A flow chart illustrating an operation of specifying a defective laser diode.

FIG. 8 is a flow chart illustrating an operation of specifying the defective LD. The method of specifying the defective LD is described hereinafter using an example of a case where the number of the laser light source modules is six (a case of n=6) as illustrated in FIG. 6. However, the description is based on an assumption of a failure that the LD 3 of the laser light source module 103 does not emit the light while maintaining the diode characteristics ("the no light emission with Vf" in FIG. 7) to simply show an algorithm.

The control unit 8 controls the six laser light source modules 101 to 106, and when one of them has a failure and does not emit the light, the control unit 8 can control only the laser light source module which does not emit the light (the laser light source module 103 in the present example).

Firstly, the control unit 8 divides the six laser light source modules 101 to 106 into two groups (a first group and a second group) (Step S01). For example, the laser light source modules 101 to 103 belong to the first group, and the laser light source modules 104 to 106 belong to the second group. Subsequently, the control unit 8 outputs the control signal for making the bypass circuit 4 enter the on state (the control signal: high) to all of the laser light source modules 101 to 103 of the first group. Subsequently, in this state, the control unit 8 obtains a voltage value at both ends of the current source 1 via a voltage measurement circuit 83 (Step S02).

Next, the control unit 8 determines whether or not the obtained voltage value at both ends of the current source 1 is larger than a predetermined reference voltage value (Step S03). Herein, the reference voltage value is (n−1)×Vf. In the present example, the reference voltage value is set to 5×Vf by reason of n=6. A state where the voltage value at both ends of the current source 1 is larger than the reference voltage value indicates that the first group does not include the defective laser light source module. In the meanwhile, a state where the voltage value at both ends of the current source is substantially equal to the reference voltage value indicates that the first group includes the defective laser light source module. In the present example, the voltage value at both ends of the current source 1 obtained by the control unit 8 in Step S02 is 5×Vf. A reason thereof is that the first group includes the defective laser light source module 103, and the bypass circuit 4 enters the on state under the control signal, thus the voltage at both ends of the LD 3 decreases to substantially zero.

In Step S03, when the voltage value at both ends of the current source 1 is larger than the reference voltage value, the control unit 8 selects the second group (Step S04). In the meanwhile, when the voltage value at both ends of the current source 1 is substantially the same as the reference voltage value, the control unit 8 selects the first group (Step S05). In the present example, the voltage value at both ends of the current source 1 is substantially the same as the reference voltage value, thus the control unit 8 selects the first group.

Next, the control unit 8 determines whether or not the group selected in Step S04 or Step S05 is made up of a single laser light source module (Step S06). In the present example, the control unit 8 selects the first group in Step S04, and the first group includes the three laser light source modules, thus the processing proceeds to Step S08.

In the meanwhile, when the group selected in Step S06 is made up of the single laser light source module, the control unit 8 specifies the LD 3 of the laser light source module as the defective LD (Step S07).

In Step S08, the control unit 8 divides the group selected in Step S04 or Step S05 into two groups. In the present example, the control unit 8 selects the first group in Step S04, thus the control unit 8 divides the first group into new first and second groups. For example, the control unit 8 makes the laser light source module 101 belong to the new first group and makes the laser light source modules 102 and 103 belong to the new second group. Subsequently, the control unit 8 executes the operation of Step S02 again.

In Step S02, the control unit 8 outputs the control signal for making the bypass circuit 4 enter the on state to all of the laser light source module 101 of the first group. Subsequently, in this state, the control unit 8 obtains the voltage value at both ends of the current source 1 via the voltage measurement circuit 83. Herein, the voltage value obtained by the control unit 8 is 6×Vf.

Subsequently, the control unit 8 executes Step S03 described above again. That is to say, the control unit 8 determines whether or not the obtained voltage value (6×Vf) is larger than the reference voltage value (5×Vf). In the present example, the obtained voltage value is larger than the reference voltage value, thus the control unit 8 selects the second group (Step S04).

Next, the control unit 8 divides the selected group (the second group in the present example) into two groups in Step S08. The control unit 8 makes the laser light source module 102 belong to a new first group and makes the laser light source module 103 belong to a new second group. Subsequently, the control unit 8 executes the operation of Step S02 again.

In Step S02, the control unit 8 outputs the control signal for making the bypass circuit 4 enter the on state to all of the laser light source module 102 of the first group. Subsequently, in this state, the control unit 8 obtains the voltage value at both ends of the current source 1 via the voltage measurement circuit 83. Herein, the voltage value obtained by the control unit 8 is 6×Vf.

Subsequently, the control unit 8 executes Step S03 described above again. That is to say, the control unit 8 determines whether or not the obtained voltage value (6×Vf) is larger than the reference voltage value (5×Vf). In the present example, the obtained voltage value is larger than the reference voltage value, thus the control unit 8 selects the second group (Step S04).

Next, the control unit 8 determines whether or not the selected group is made up of a single laser light source module (Step S06). In the present example, the control unit 8 selects the first group in Step S04, and the first group is made up of the single laser light source module 103, thus the processing proceeds to Step S07. In Step S07, the control unit 8 specifies the LD 3 of the laser light source module 103 as the defective LD.

As described above, the control unit 8 can specify the laser light source module 103 including the defective LD 3 from the six laser light source modules 101 to 106 by performing the determination operation three times.

The above example is described on the assumption of the failure that the LD 3 does not emit the light while maintaining the voltage at both ends Vf (the failure due to no light emission with Vf in FIG. 7), however, the defective LD 3 can be specified by the same method even when the LD 3 has the open failure. The defective LD 3 can be specified by the same method even when the LD 3 has the half short-circuit failure other than the complete short-circuit state.

Described is a method of determining the type of the failure of the LD after the defective LD is specified. The control unit 8 obtains the voltage value at both ends of the current source 1 (referred to as V1) while outputting the control signal for making the bypass circuit 4 enter the on state (the control signal: high) to the laser light source module determined to have the failure. The control unit 8 obtains the voltage value at both ends of the current source 1 (referred to as V2) while outputting the control signal for making the bypass circuit 4 enter the off state (the control signal: low) to the laser light source module determined to have the failure.

When a difference between V1 and V2 corresponds to the release voltage of the current source 1, the control unit 8 determines that the type of the failure of the LD is the open failure. When the difference between V1 and V2 corresponds to a floating voltage, the control unit 8 determines that the type of the failure of the LD is the half short-circuit failure. When the difference between V1 and V2 corresponds to Vf, the control unit 8 determines that the type of the failure of the LD is the no light emission with Vf.

<Effect>

The laser light source module 100 according to the present embodiment 1 includes the laser diode 3, the bypass circuit 4 parallelly connected to the laser diode 3 and diverting the current flowing to the laser diode when the bypass circuit 4 is in the on state, a light detection circuit 5 detecting the laser light of the laser diode 3, and the bypass circuit switching circuit 6 switching the bypass circuit 4 to the on state in accordance with the control signal being input thereto, and the bypass circuit switching circuit 6 can switch the bypass circuit 4 to the on state in accordance with the state where the light detection circuit 5 does not detect the laser light.

In the laser light source module 100 according to the present embodiment 1, the bypass circuit 4 can be switched to the on state in accordance with the state where the light detection circuit 5 does not detect the laser light. Accordingly, even when the LD 3 has the failure that the LD 3 does not emit the light while maintaining the diode characteristics, the current can be reliably diverted to the bypass circuit 4.

In the laser light source module 100 according to the present embodiment 1, the bypass circuit switching circuit 6 has the photovoltaic output photo coupler 61.

In the photovoltaic output photo coupler 61, the light emitting element 63 on the input side and the photoelectric conversion element 62 on the output side are electrically insulated from each other. Thus, the photoelectric conversion element 62 can provide the switching element 41 with the control voltage by the electromotive force based on the ground on a side of the laser light source module (that is to say, the LD_GND 9). Since the input side and output side of the bypass circuit switching circuit 6 are insulated from each other, the switching element 41 of the bypass circuit 4 is in the on state (the conduction state), and this state can be stably maintained even after the power supply terminals 2*a* and 2*b* are short-circuited.

In the laser light source module 100 according to the present embodiment 1, the light detection circuit 5 has the photo transistor 51.

When the photo transistor 51 is applied to the light detection circuit 5, the function of the light detection circuit 5 can be achieved while reducing an increase in a circuit size of the laser light source module 100.

In the laser light source module 100 according to the present embodiment 1, the light detection circuit 5 may have the comparator and the photo diode 52.

Accordingly, when the schmitt trigger circuit having the photo diode 52 as the input voltage is applied to the light detection circuit 5, the laser light can be stably detected even when an output intensity of the laser light of the LD 3 fluctuates.

In the laser light source module 100 according to the present embodiment 1, the bypass circuit 4 has the switching element 41, the bypass circuit 4 is in the on state when the switching element 41 is in the on state, the bypass circuit switching circuit 6 drives the control terminal of the switching element 41, and the bypass circuit switching circuit 6 can drive the control terminal of the switching element 41 in accordance with the state where the light detection circuit 5 does not detect the laser light.

In the present embodiment 1, the switching element 41 such as the N channel MOSFET is disposed in the bypass circuit 4, and the bypass circuit switching circuit 6 controls the switching element 41, thus can switch the bypass circuit 4 to the on state.

The light source device 500 according to the present embodiment 1 includes the plurality of the laser light source modules 100 and the control unit 8 individually outputting the control signal to the bypass circuit switching circuits 6 of the plurality of the laser light source module 100. The plurality of the laser light source modules 100 are connected in series. The light source device 500 further includes the current source 1 supplying the current to the plurality of the laser light source modules 100 connected in series.

In the laser light source module 100 according to the present embodiment 1, when the LD 3 breaks down and does not emit the light, the current flowing in the LD 3 which does not emit the light can be diverted to the bypass circuit 4. Accordingly, even when any of the LDs 3 breaks down and does not emit the light in the light source device in which the plurality of the laser light source modules 100 are connected in series, the current flowing in the defective LD 3 is diverted, thus light output from the other normal LD 3 can be continued.

The method of specifying the failure laser diode according to the present embodiment 1 is the method of specifying the failure laser diode to specify the defective laser diode in the light source device 500. The light source device 500 further includes the voltage measurement circuit 83 measuring the voltage at both ends of the current source 1, and the method includes the steps that: (a) the control unit 8 divides the plurality of the laser light source modules 100 into the two groups; (b) the control unit 8 obtains the voltage value at both ends of the current source 1 while outputting the control signal for switching the bypass circuit 4 to the on state to all of the laser light source modules 100 belonging to one of the two groups; (c) the control unit 8 selects one of the two groups in accordance with the voltage value obtained in the step (b); and (d) the control unit 8 divides the group selected in the step (c) into the two groups. The control unit 8 performs the steps (b), (c), and (d) repeatedly, and when the group selected in the step (c) includes the single laser light source module 100, the control unit 8 specifies the laser diode 3 included in the single laser light source module 100 as the defective laser diode 3.

According to the method of specifying the failure laser diode in the present embodiment 1, the voltage value at both ends of the current source 1 is measured while switching high and low of the control signal being output to each laser light source module 100, thus the LD 3 which breaks down and does not emit the light can be specified. Thus, the circuit configuration of the light source device 500 can be simplified compared to the method of independently measuring the voltage of the plurality of the LDs 3. According to the specifying method of the present embodiment 1. the control unit 8 can specify the defective LD from among the n LDs by repeating the steps (b), (c), and (d) described above r times satisfying $2^{r-1} < n \leq 2^r$. Accordingly, the specifying method of the present embodiment 1 is particularly effective in the case where the light source device 500 includes the large number of laser light source modules 100.

In the step (c) of the method of specifying the failure laser diode according to the present embodiment 1, the control unit 8 selects one group from the two groups when the voltage value obtained in the step (b) is the predetermined reference voltage value, and selects the other group from the two groups when the voltage value obtained in the step (b) is smaller than the reference voltage value.

Accordingly, when the total number of the LDs is set to n, the forward voltage of the LD at the time of flowing the current from the current source 1 to the LD is set to Vf, and the reference voltage value is set to (n−1)×Vf, the LD having the open failure, the half short-circuit failure other than the complete short-circuit state, or the failure due to no light emission with Vfcan be specified.

The method of specifying the failure laser diode according to the present embodiment 1 further includes the steps that: (e) after the defective laser diode is specified, the control unit 8 obtains the voltage value V1 at both ends of the current source 1 while outputting the control signal for switching the bypass circuit 4 to the on state to the laser light source module 100 including the defective laser diode; (f) after the defective laser diode is specified, the control unit 8 obtains the voltage value V2 at both ends of the current source 1 while outputting the control signal for switching the bypass circuit 4 to the off state to the laser light source module 100 including the defective laser diode; (g) the control unit 8 determines the type of the failure of the defective laser diode in accordance with the difference between the voltage value V1 and the voltage value V2.

Accordingly, in the present embodiment 1, the voltage value at both ends of the current source 1 is measured while switching high and low of the control signal being output to each laser light source module 100, thus it is possible to not only specify the LD 3 which breaks down and does not emit but also determine the type of the failure of the LD 3.

<Embodiment 2>

Figure 9:
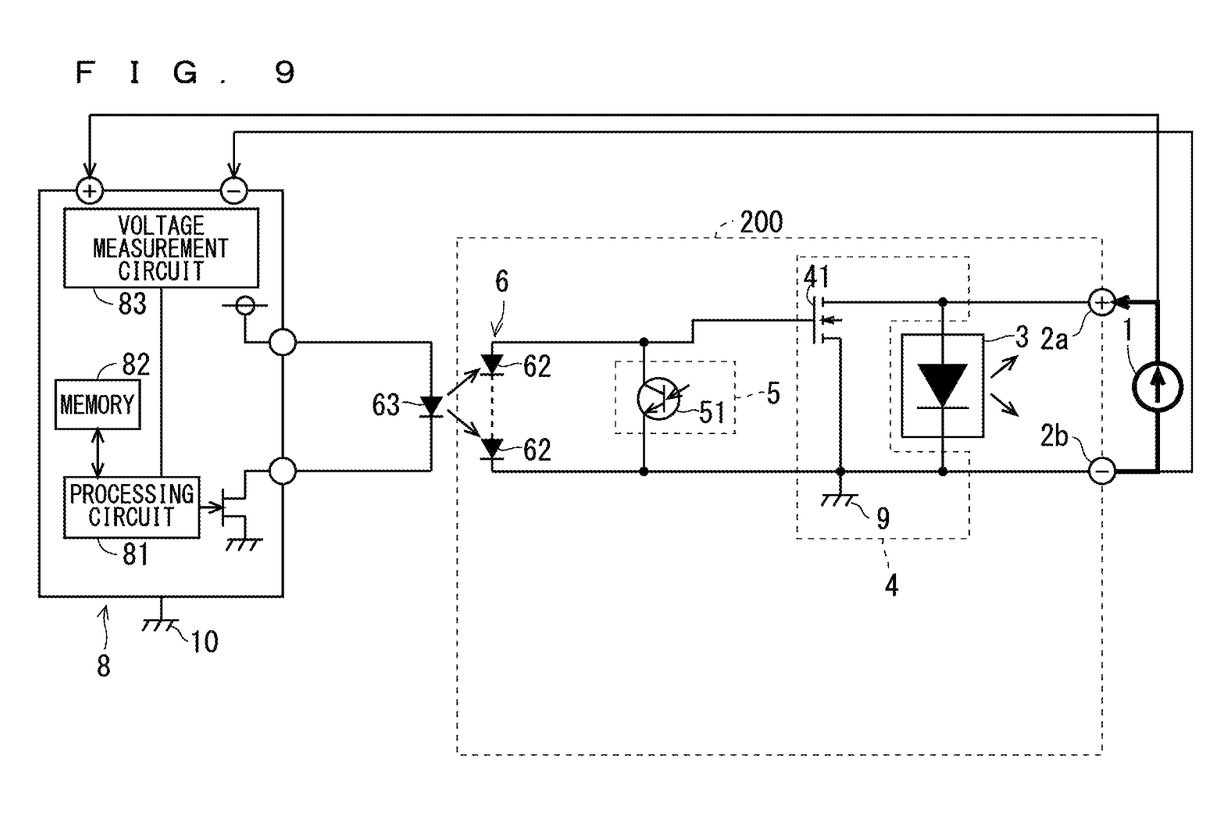
FIG. 9 A drawing illustrating a circuit configuration of a laser light source module according to an embodiment 2.

FIG. 9 is a drawing illustrating a circuit configuration of a laser light source module 200 according to the present embodiment 2. In the laser light source module 200, the configuration of the bypass circuit switching circuit 6 is different from that of the laser light source module 100 (FIG. 1). Since the other configuration is similar to FIG. 1, the description is omitted.

In the laser light source module 100, the bypass circuit switching circuit 6 is achieved by the photovoltaic output photo coupler 61. The current is input as the control signal (high or low) from the control circuit 8 to the bypass circuit switching circuit 6.

In the meanwhile, in the laser light source module 200 according to the present embodiment 2, the bypass circuit switching circuit 6 has the photoelectric conversion element 62. The photoelectric conversion element is the photo diode, for example. The light signal is input as the control signal (high or low) from the control circuit 8 to the bypass circuit switching circuit 6. The light signal is output by the light emitting element 63 provided on the side of the control unit 8.

Since the operation of the laser light source module 200 in the present embodiment 2 is the same as that in the embodiment 1 except that the control signal is the light signal, the description thereof is omitted. Each of the laser light source module 101 to 106 of the light source device 500 described in the embodiment 1 may be replaced with the laser light source module 200. The method of specifying the failure LD described in the embodiment 1 can also be applied to the light source device having such a configuration.

<Effect>

In the laser light source module 200 according to the present embodiment 2, the bypass circuit switching circuit 6 has the photoelectric conversion element 62, and the control signal being input to the bypass circuit switching circuit 6 is the light signal.

Accordingly, even when the control signal being input to the laser light source module 200 is the light signal as is the case in the present embodiment 2, the effect similar to the embodiment 1 can be obtained.

The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

1 current source, 2a, 2b power supply terminal, 3 laser diode, 4 bypass circuit, 41 switching element, 5 light detection circuit, 51 photo transistor, 52 photo diode, 53 schmitt trigger circuit, 54 switching element, 6 bypass circuit switching circuit, 61 photovoltaic output photo coupler, 62 photoelectric conversion element, 63 light emitting element, 6a, 6b output terminal, 7a, 7b control terminal, 8 control unit, 81 processing circuit, 82 memory, 83 voltage measurement circuit, 9 laser diode ground, 10 control ground, 100, 101, 102, 103, 104, 105, 106, 200 laser light source module, 202 conductive ribbon, 203 stem base, 205 substrate, 206 conductive pattern, 210 sub-mount substrate, 210a insulating substrate, 210b, 210c conductive pattern, 210d retention block-side conductive pattern, 211 retention block, 212 conductive wiring, 500 light source device.

The invention claimed is:

1. A laser light source module, comprising:
   a laser diode;
   a bypass circuit being parallelly connected to the laser diode and diverting current flowing to the laser diode when the bypass circuit is in an on state;
   a light detection circuit detecting laser light of the laser diode; and
   a bypass circuit switching circuit switching the bypass circuit to the on state in accordance with a control signal being input to the bypass circuit switching circuit, wherein
   in accordance with a state where the light detection circuit does not detect the laser light, the bypass circuit switching circuit can switch the bypass circuit to the on state,
   the bypass circuit switching circuit has a photoelectric conversion element, and
   a control signal being input to the bypass circuit switching circuit is a light signal.

2. The laser light source module according to claim 1, wherein the bypass circuit switching circuit has a photovoltaic output photo coupler.

3. The laser light source module according to claim 1, wherein the light detection circuit has a photo transistor.

4. A method of specifying a failure laser diode to specify a defective laser diode in a light source device, wherein
   the light source device includes a plurality of laser light source modules being connected in series,
   each of the plurality of the laser light source modules includes:
   a laser diode;
   a bypass circuit being parallelly connected to the laser diode and diverting current flowing to the laser diode when the bypass circuit is in an on state;
   a light detection circuit detecting laser light of the laser diode; and
   a bypass circuit switching circuit switching the bypass circuit to the on state in accordance with a control signal being input to the bypass circuit switching circuit,
   in accordance with a state where the light detection circuit does not detect the laser light, the bypass circuit switching circuit can switch the bypass circuit to the on state,
   the light source device further includes:
   a controller individually outputting the control signal to the bypass circuit switching circuit of each of the plurality of the laser light source modules;
   a current source supplying current to the plurality of the laser light source modules being connected in series; and
   a voltage measurement circuit measuring voltage at both ends of the current source, and
   the method of specifying the failure laser diode includes steps that
   (a) the controller divides the plurality of the laser light source modules into two groups;
   (b) the controller obtains a voltage value at both ends of the current source while outputting the control signal for switching the bypass circuit to the on state to all of the laser light source modules belonging to one of the two groups;
   (c) the controller selects one of the two groups in accordance with the voltage value obtained in the step (b); and
   (d) the controller divides a group selected in the step (c) into two groups, wherein
   the controller performs the steps (b), (c), and (d) repeatedly, and when the group selected in the step (c) includes a single one of the laser light source modules, the controller specifies the laser diode included in the single one of the laser light source modules as a defective laser diode.

5. The method of specifying the failure laser diode according to claim 4, wherein
   in the step (c), the controller selects one of the two groups when the voltage value obtained in the step (b) is a predetermined reference voltage value, and selects another one of the two groups when the voltage value obtained in the step (h) is smaller than the reference voltage value.

6. The method of specifying the failure laser diode according to claim 4, further comprising steps that:
   (e) after the defective laser diode is specified, the controller obtains a voltage value V1 at both ends of the current source while outputting the control signal for switching the bypass circuit to the on state to the laser light source module including the defective laser diode;
   (f) after the defective laser diode is specified, the controller obtains a voltage value V2 at both ends of the current source while outputting the control signal for switching the bypass circuit to an off state to the laser light source module including the defective laser diode; and
   (g) the controller determines a type of a failure of the defective laser diode in accordance with a difference between the voltage value V1 and the voltage value V2.

7. The laser light source module according to claim 1, wherein the light detection circuit is connected to a control input of the bypass circuit such that the light detection circuit connects the control input to ground when light is detected and disconnects the control input from ground when light is not detected.

* * * * *